(12) United States Patent
Tsai et al.

(10) Patent No.: US 9,093,985 B2
(45) Date of Patent: Jul. 28, 2015

(54) PORTABLE CONTROL APPARATUS AND METHOD THEREOF FOR CALIBRATING AN OSCILLATING CIRCUIT

(75) Inventors: Huimin Tsai, Hsinchu Hsien (TW); Chi Kang Liu, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 1018 days.

(21) Appl. No.: 12/844,413

(22) Filed: Jul. 27, 2010

(65) Prior Publication Data

US 2011/0080381 A1    Apr. 7, 2011

(30) Foreign Application Priority Data

Oct. 6, 2009    (TW) .............................. 98133900 A

(51) Int. Cl.
| | |
|---|---|
| *H03J 1/00* | (2006.01) |
| *G06F 1/08* | (2006.01) |
| *H03J 7/04* | (2006.01) |
| *H03L 7/06* | (2006.01) |

(52) U.S. Cl.
CPC ................. *H03J 1/0008* (2013.01); *G06F 1/08* (2013.01); *H03J 7/04* (2013.01); *G09G 2320/0693* (2013.01); *H03L 7/06* (2013.01)

(58) Field of Classification Search
CPC ......... G09G 5/00; G09G 5/005; G09G 5/008; G09G 5/18; G09G 2320/06; G09G 2320/0606; G09G 2320/0613; G09G 23/0693; G09G 2320/08; G09G 2340/04; G09G 2340/0435; G09G 2340/145; H03L 7/06; H03L 7/08; H03L 7/0805; H03L 7/095; G06F 1/08; H03J 7/04; H03J 1/0008

USPC ................. 345/3.2, 99, 204, 213; 327/39–47, 327/145–147, 155–156; 331/1 R, 18, 20, 34, 331/36 R, 47–48; 348/194, 478, 512, 516, 348/536–547

See application file for complete search history.

(56) References Cited

U.S. PATENT DOCUMENTS

| | | | |
|---|---|---|---|
| 4,847,569 A * | 7/1989 | Dudziak et al. ................. 331/25 |
| 5,036,216 A * | 7/1991 | Hohmann et al. ............ 327/157 |
| 5,136,260 A * | 8/1992 | Yousefi-Elezei ................ 331/17 |
| 5,270,821 A * | 12/1993 | Samuels ........................ 348/552 |
| 5,543,754 A * | 8/1996 | Onodera ......................... 331/25 |
| 5,574,406 A * | 11/1996 | Sauer et al. ..................... 331/11 |
| 5,614,870 A * | 3/1997 | Sauer et al. ..................... 331/14 |
| 5,982,836 A * | 11/1999 | Sakae et al. ................... 375/376 |
| 5,990,858 A * | 11/1999 | Ozolins ........................... 345/99 |
| 6,005,425 A * | 12/1999 | Cho ............................. 327/156 |
| 6,316,974 B1 | 11/2001 | Taraci et al. |
| 6,441,658 B1 | 8/2002 | Taraci et al. |

(Continued)

FOREIGN PATENT DOCUMENTS

CN    1384959 A    12/2002

*Primary Examiner* — Temesgh Ghebretinsae
*Assistant Examiner* — Keith Crawley
(74) *Attorney, Agent, or Firm* — Edell, Shapiro & Finnan, LLC

(57) ABSTRACT

A portable control apparatus includes a driver, a baseband controller, and a crystal oscillator. The driver includes an oscillating circuit that generates a feedback signal. The baseband controller coupled to the driver receives the feedback signal, and outputs a calibrating signal to the driver according to the feedback signal. The crystal oscillator coupled to the baseband controller generates an accurate output frequency for operating the baseband controller.

15 Claims, 3 Drawing Sheets

(56) References Cited

U.S. PATENT DOCUMENTS

| | | | |
|---|---|---|---|
| 6,456,165 B1* | 9/2002 | Kelkar | 331/17 |
| 7,078,977 B2* | 7/2006 | Maneatis | 331/16 |
| 7,103,130 B2* | 9/2006 | Cao et al. | 375/374 |
| 7,336,134 B1* | 2/2008 | Janesch et al. | 331/36 C |
| 7,827,424 B2* | 11/2010 | Bounitch | 713/322 |
| 8,183,937 B2* | 5/2012 | McDonald et al. | 331/18 |
| 2002/0196366 A1* | 12/2002 | Cahill, III | 348/537 |
| 2003/0001680 A1* | 1/2003 | Knecht et al. | 331/18 |
| 2003/0090305 A1* | 5/2003 | Kobayashi et al. | 327/156 |
| 2005/0052440 A1* | 3/2005 | Kim et al. | 345/204 |
| 2005/0270108 A1* | 12/2005 | Wilson et al. | 331/2 |
| 2006/0256125 A1* | 11/2006 | Neal et al. | 345/589 |
| 2009/0251226 A1* | 10/2009 | Kathuria et al. | 331/1 R |
| 2009/0278620 A1* | 11/2009 | Taghivand et al. | 331/36 |
| 2009/0310730 A1* | 12/2009 | Zhidkov et al. | 375/376 |

* cited by examiner

PORTABLE CONTROL APPARATUS AND METHOD THEREOF FOR CALIBRATING AN OSCILLATING CIRCUIT

CROSS REFERENCE TO RELATED PATENT APPLICATIONS

This patent application claims priority from Taiwan Patent Application No. 098133900, filed in the Taiwan Patent Office on Oct. 6, 2009, entitled "Portable Control Apparatus and Method Thereof", and incorporates the Taiwan patent application in its entirety by reference.

TECHNICAL FIELD

The present disclosure relates to a portable control apparatus, and more particularly, to a portable control apparatus for calibrating a control signal and a method thereof.

BACKGROUND OF THE PRESENT DISCLOSURE

FIG. 1 shows a schematic diagram illustrating a conventional control apparatus 100 comprising a driver 110 and a baseband controller 120. In the prior art, in order to reduce cost, when the control apparatus 100 is applied to a mobile phone, frame rate of the mobile phone is determined according to an oscillator 111 built-in the driver 110 of the controller 100, and is associated with resistance and capacitance of the oscillator 111. In a fabrication process of an integrated circuit (IC), a fabrication parameter drift often exists between chips and crystal grains, which cause different capacitance and resistance of the oscillators 111 in different batches of mobile phones; as a result, inconsistencies exist for different batches of the same product before being shipped from the factory. In order to achieve an object that the frame rate conforms to the specification, the conventional driver 110 includes a one-time programming (OTP) component 113 to measure if parameters of a product meet the standard requirements of the specification during a chip probing (CP) test. Parameters that do not achieve the requirements in the specification are fine-tuned by the OTP 113. However, it is possible that a repaired chip may still fail to meet the specification and is then classified as a defective chip that cannot be shipped to customers—such defective chips are then accounted for yield loss.

When implementing the OTP component 13, apart from causing the yield loss, additional test time and test cost are needed to perform the CP test. Also, product utilization flexibility is reduced since electrical parameters cannot be altered after being finalized by the OTP. Therefore, a control apparatus capable of adjusting a frame rate of a portable apparatus, increasing utilization flexibility and reducing test time and test cost and a method thereof are in need.

SUMMARY OF THE PRESENT DISCLOSURE

According to an embodiment of the present disclosure, a control apparatus applied to a portable multi-media apparatus comprises a driver, a baseband controller, and a crystal oscillator. The driver comprising an oscillating circuit generates feedback signal. The baseband controller coupled to the driver receives the feedback signal, and outputs a calibration signal to the driver. The crystal oscillator coupled to the baseband controller generates an accurate output frequency for operating the baseband controller.

According to another embodiment, a control method applied to a portal apparatus comprises transmitting a feedback signal to a baseband controller by a driver; estimating an offset between a frequency of the feedback signal and an ideal frequency by the baseband controller; generating a calibration signal to the driver according to the offset by the baseband controller; generating an operating frequency corresponding to the calibration signal by the driver; and generating a display control signal according to the operating frequency by the driver.

According to yet another embodiment of the present disclosure, a driver applied to a portable multi-media apparatus comprises an oscillating circuit and a register. The register coupled to the oscillating circuit stores a calibration code represented by a calibration signal from a baseband controller. The oscillating circuit generates an operating frequency according to the calibration code stored in the register.

According to still another embodiment of the present disclosure, a baseband controller, applied to a potable multi-media apparatus, coupled to a crystal oscillator, receives a reference signal. The baseband controller comprises a phase locked loop (PLL) unit, and a control circuit. The PLL unit coupled to the crystal oscillator PLL controls the reference signal to generate an operating frequency. The control circuit coupled to the PLL unit estimates a frequency offset of a feedback signal according to the operating frequency, and outputs a calibration signal according to the offset.

BRIEF DESCRIPTION OF THE DRAWINGS

Following description and figures are disclosed to gain a better understanding of the advantages of the present disclosure.

DETAILED DESCRIPTION OF THE PREFERRED EMBODIMENT

Figure 1:
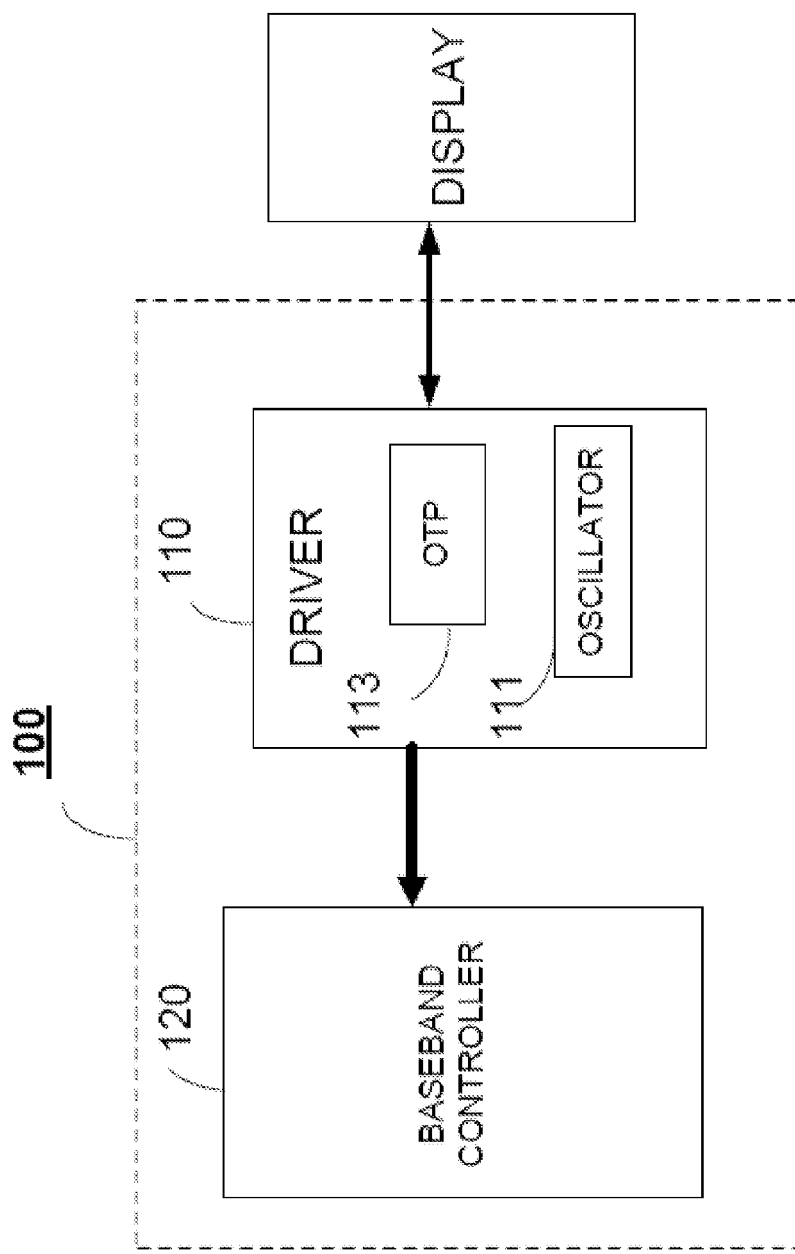
FIG. 1 is a schematic diagram of a conventional control apparatus.
Figure 2:
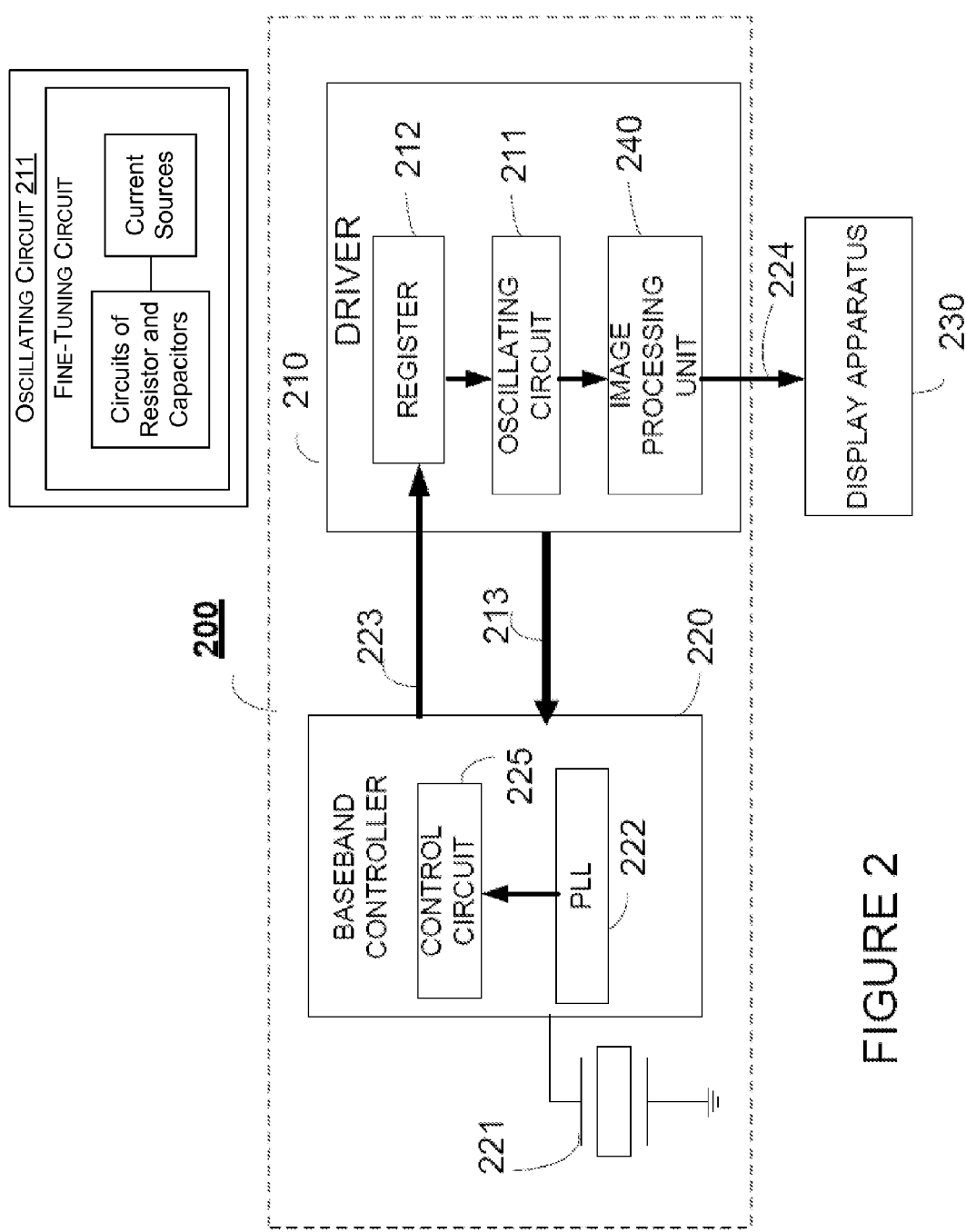
FIG. 2 is a schematic diagram of a control method in accordance with an embodiment of the present disclosure.

FIG. 2 shows a schematic diagram of a control apparatus 200 applied to a portable multi-media apparatus in accordance with an embodiment of the present disclosure. The control apparatus 200 comprises a driver 210, a baseband controller 220, and a crystal oscillator 221. The control apparatus 200 coupled to a display apparatus 230 generates a display control signal 224 to the display apparatus 230. The driver 210 is connected to the baseband controller 220 via a flexible printed circuit (FPC). The driver 210 comprises an oscillating circuit 211, a register 212, and an image processing unit 240. In this embodiment, the oscillating circuit 211 may be a voltage-controlled oscillator (VCO) or a current-controlled oscillator (CCO). The driver 210 outputs a feedback signal 213 to the baseband controller 220, and the feedback signal 213 may be a frame mark signal, a VCO output signal, a CCO output signal, a common voltage signal Vcom, a horizontal synchronization signal or a vertical synchronization signal. A frequency of the feedback signal 213 is correlated with an output operating frequency of the oscillating circuit 211, which comprises a built-in fine-tuning circuit for generating different output operating frequencies. Upon receiving the feedback signal 213, the baseband controller 220 estimates the frequency of the feedback signal 213 and offset between the frequency of the feedback signal 213 and a predetermined frequency, such as an ideal frequency. Therefore, a calibration value is obtained for the frequency of the feedback signal 213 to approach the ideal frequency. The baseband controller 220 coupled to the crystal oscillator 221 generates a reference signal having an accurate frequency. The baseband controller 220 comprises a PLL (phase lock loop) unit 222 and a control circuit 225. The PLL unit 222 synchronizes an output clock of the crystal oscillator 221 with a reference clock by phase lock loop control, in order to output an accurate clock signal to the control circuit 225. For example, the control circuit 225 estimates the feedback signal 213 according to the accurate clock signal generated by the crystal oscillator 221, and compares the feedback signal 213 with the accurate clock signal generated by the crystal oscillator 221 or with a multiple of frequency of the accurate clock signal, so as to determine an offset or an offset rate between the frequency of the feedback signal 213 and the ideal frequency. For example, the control circuit 225 is realized by a micro-processor.

In this embodiment, the baseband controller 220 searches for a calibration code from a lookup table, where the calibration code corresponds to a calibration value needed for calibrating the frequency of the feedback signal 213. Then a calibration signal 223 corresponding to the calibration value is transmitted to the driver 210. It is to be noted that, due to that the offset between the estimated frequency of the feedback signal 213 and the predetermined frequency may not be exactly identical to calibration values of the lookup table, the baseband controller 220 selects a calibration value from the lookup table that is most approximate to the offset, or performs the calibration several times until a difference between a total calibration value and the offset is smaller than an acceptable error. The baseband controller 220 writes a corresponding calibration code into the register 212 of the driver 210 via the calibration signal 223. Upon accessing the calibration code of the register 212, the oscillating circuit 211 determines a corresponding operating frequency that allows the image processing unit 240 to generate the display control signal 224 to the display apparatus. In this embodiment of the present disclosure, without needing an OTP component built in an external crystal oscillator, the difference between frequency of the display control signal 224 and specification-defined or user-defined frequency is maintained as being smaller than an acceptable error offset to meet hardware operating requirements.

TABLE 1

| Calibration Code | Calibration Value |
|---|---|
| 000 | 0% |
| 001 | 3% |
| 010 | 6% |
| 011 | 9% |
| 100 | 12% |
| 101 | −3% |
| 110 | −6% |
| 111 | −9% |

Table 1 is a lookup table in accordance with an embodiment of the present disclosure. Calibration codes are transmitted to the register 212 via the calibration signal 223, and each of the calibration codes corresponds to a fine-tuning circuit built in the oscillating circuit 211. For example, the fine-tuning circuit includes a plurality of resistor-capacitor (RC) circuits or a RC circuit in conjunction with a plurality of current sources. The current sources are realized by various types of driving currents generated by a current mirror and switches. Each RC circuit determines an output operating frequency or each of current sources charges a certain RC circuit, i.e., each of the current sources determines an output operating frequency. Therefore, each of the calibration codes represents a output operating frequency of the corresponding oscillating circuit 211. Calibration values correspond to different frequency calibration values, which are correlated with ratios of different calibration RC circuits to a predetermined RC circuit, or are correlated with ratios of different driving currents to a reference current. Supposing that the fabrication drift causes absolute value drifts in a total capacitance, in a total resistance of a chip and in a driving current outputted by a current source, but in fact it barely affects ratios of different resistors, different capacitors and different driving currents outputted by current sources. In this embodiment, calibration value column in a lookup table is represented by a calibration ratio. Upon receiving the calibration signal 223 from the baseband controller 220, the oscillating circuit 211 of the driver 210 selects a calibration RC circuit corresponding to the calibration signal 223, or selects a corresponding current source to charge a RC circuit, so as to generate an operating frequency to the image processing unit 240. After that, the calibrated display control signal 224 is generated according to the operating frequency to the display apparatus 230, so that an offset between the frequency of the display control signal 224 and a predetermined frequency such as an ideal frequency is smaller than a predetermined error.

In this embodiment, the driver 210 need not involve the OTP fabrication process, i.e., the driver 210 is capable of achieving an effect of reducing chip manufacturing time and cost without implementation of the CP test or the OTP to calibrate the output frequency of the oscillating circuit 211. In this embodiment, calibration of the feedback signal 213 may be carried out when a portable multi-media apparatus is booted, or a user may dynamically carry out the calibration to approach the ideal frequency according to actual requirements. Preferably, an option of performing the calibration is provided on a user interface of the display apparatus 200. For example, upon receiving an instruction of performing the calibration, the control apparatus 200 performs the foregoing operations of calibrating the feedback signal 213 during a vertical blanking interval (VBI) to adjust a frame rate to a desired frequency. Accordingly, the calibrated frequency does not affect displaying a normal image. It is to be noted that, the foregoing calibration is not limited to being performed only once. For example, the offset is calibrated for several times, i.e., the offset is gradually calibrated as desired to dynamically calibrate the frequency of the feedback signal to the desired frequency to increase product utilization flexibility.

Figure 3:
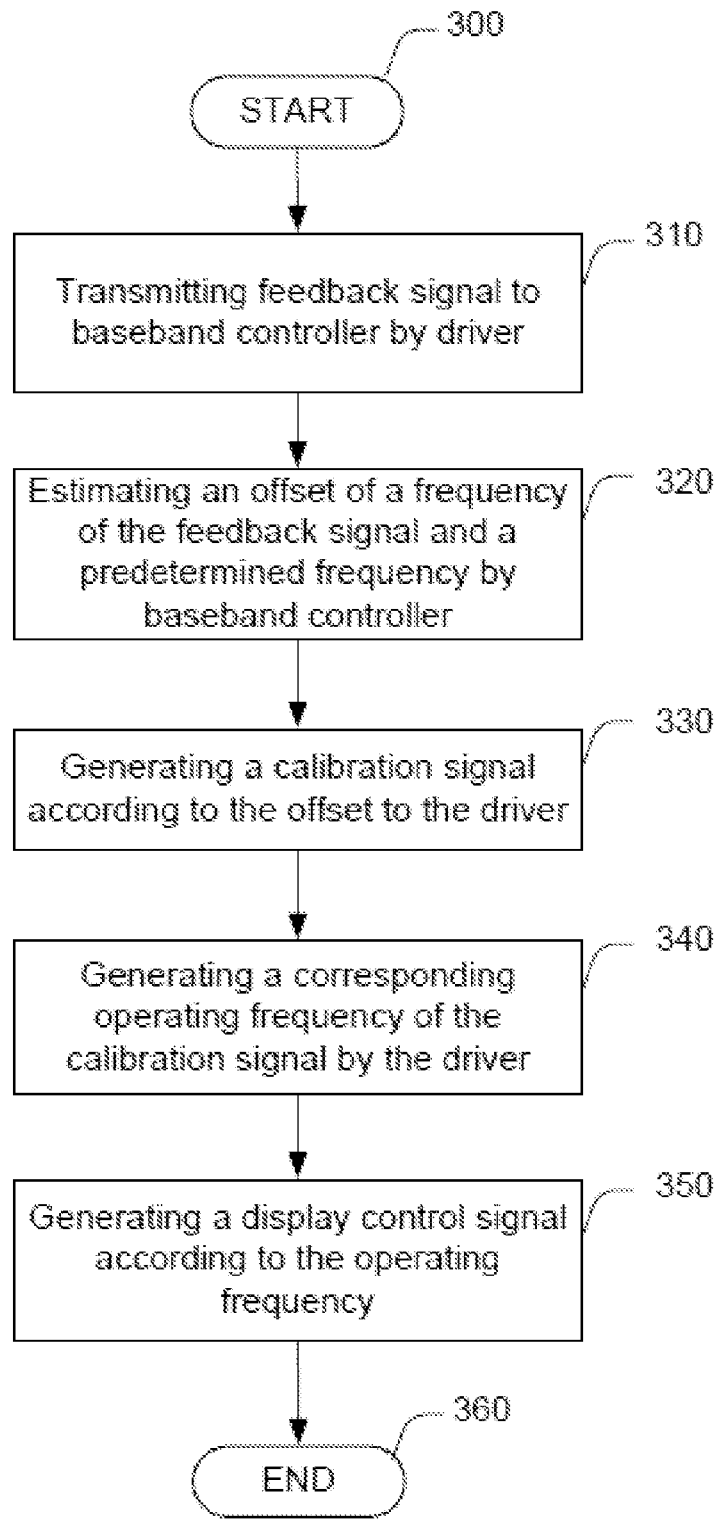
FIG. 3 is a flow chart of a control method in accordance with an embodiment of the present disclosure.

FIG. 3 shows a flow chart of a control method in accordance with an embodiment of the present disclosure. The flow begins with Step 300. Step 310 includes transmitting a feedback signal to a baseband controller by a driver, e.g., the feedback signal is a frame mark signal, a signal outputted by a VCO, a signal outputted by a CCO, a common voltage (Vcom) signal, a horizontal synchronization signal or a vertical synchronization signal. Step 320 includes estimating an offset between a frequency of the feedback signal and a predetermined frequency (such as an ideal frequency) by the baseband controller. For example, a counter counts the number of clocks of the feedback signal according to adjacent rising edges of the feedback signal to estimate the offset between the frequency of the feedback signal and the ideal frequency. Step 330 includes generating calibration signal to the driver according to the offset by the baseband controller. For example, the baseband controller adopts a lookup table to determine a calibration code corresponding to the offset, and transmits the calibration signal corresponding to the calibration code to the driver, so as to store the calibration code into a register of the driver. It is to be noted that, since the estimated offset between the frequency of the feedback signal and the predetermined frequency (such as ideal frequency) may not be exactly identical to a calibration value in the lookup table, the baseband controller selects a calibration value that is most approximate to the offset, or calibrates the frequency for several times until a difference between a total calibration value and the offset is smaller than a predetermined error. In Step 340, an operating frequency corresponding to the calibration signal is generated by the driver. For example, an oscillating circuit of the driver accesses a calibration code corresponding to the calibration signal from the register, and the calibration code represents an output operating frequency. In Step 350, a display control signal is generated according to the operating frequency by the driver. The flow ends in Step 360. According to the foregoing steps, after the flow of the control method is performed once or is repeated several times, a difference between a frequency of the generated display control signal and the ideal frequency may be smaller than the predetermined error. In another embodiment, the ideal frequency may be altered according to user requirements provided that the flow of the foregoing control method is performed during a VBI after the ideal frequency is altered.

In conclusion, according to an embodiment of the present disclosure, a control apparatus applied to a portable multi-media apparatus comprises: a driver, comprising an oscillating circuit, for generating a feedback signal; a baseband controller, coupled to the driver, for receiving the feedback signal, and outputting a calibration signal to the driver according to the feedback signal; and a crystal oscillator, coupled to the baseband controller, for generating an accurate output frequency for operating the baseband controller.

According to another embodiment of the present disclosure, a control method applied to a portable apparatus comprises transmitting a feedback signal to a baseband controller via a driver; estimating an offset between a frequency of the feedback signal and a predetermined frequency (e.g., an ideal frequency) by the baseband controller; generating a calibration signal to the driver according to the offset by the baseband controller; generating an operating frequency corresponding to the calibration signal by the driver; and generating a display control signal according to the operating frequency by the driver.

According to yet another embodiment of the present disclosure, a driver applied to a portable multi-media apparatus comprises an oscillating circuit and a register. The register coupled to the oscillating circuit is for storing a calibration code represented by a calibration signal from a baseband controller. The oscillating circuit generates an operating frequency according to the calibration code stored in the register.

According to still another embodiment of the present disclosure, a baseband controller applied to a portable multi-media apparatus is coupled to a crystal oscillator. The baseband controller receiving a reference signal comprises a PLL unit, coupled to the crystal oscillator, for PLL controlling the reference signal to generate an operating frequency; and a control circuit, coupled to the PLL unit, for estimating a frequency offset of a feedback signal according to the operating frequency, and outputting a calibration signal according to the offset.

While the disclosure has been described in terms of what is presently considered to be the most practical and preferred embodiments, it is to be understood that the present disclosure needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A control apparatus, applied to a portable multi-media apparatus, comprising:
    a driver, comprising:
    an oscillating circuit, that generates a feedback signal and receives a calibration signal, the oscillating circuit further configured to determine an operating frequency based at least in part on a calibration value indicated in the calibration signal by way of selecting a corresponding set of a fine-tuning circuit,
    an image processing unit, coupled to the oscillating circuit, that generates a display control signal according to the operating frequency and provides the display control signal to a display of the portable multi-media apparatus, the image processing unit configured to generate the display control signal such that an offset between a frequency of the display control signal and a predetermined frequency is smaller than a predetermined error to meet operating requirements of the portable multi-media apparatus;
    a baseband controller, coupled to the driver, that receives the feedback signal and outputs the calibration signal to the driver according to the feedback signal, wherein a frequency of the feedback signal is correlated to the operating frequency; and
    a crystal oscillator, coupled to the baseband controller, that provides a reference output frequency to the baseband controller, the reference output frequency being used for generating the calibration signal,
    wherein the display apparatus provides a user interface that presents an option of performing a calibration process resulting in generating the calibration signal, and
    wherein the baseband controller comprises a look up table and the baseband controller is configured to search for a calibration code corresponding to the calibration value, the calibration code controlling the fine-tuning circuit.

2. The control apparatus as claimed in claim 1, wherein the feedback signal is a frame mark signal, a signal generated by a voltage-controlled oscillator (VCO), a signal generated by a current-controlled oscillator (CCO), a common voltage signal, a horizontal synchronization signal, or a vertical synchronization signal.

3. The control apparatus as claimed in claim 1, wherein the driver comprises a register that temporarily stores the calibration code in response to the calibration signal.

4. The control apparatus as claimed in claim 1, wherein the baseband controller further comprises a control circuit that estimates an offset between the frequency of the feedback signal and the predetermined frequency.

5. The control apparatus as claimed in claim 4, wherein the predetermined frequency is user-defined.

6. The control apparatus as claimed in claim 4, wherein the baseband controller outputs the calibration signal according to the offset between the frequency of the feedback signal and the predetermined frequency.

7. The control apparatus as claimed in claim 4, wherein the offset between the frequency of the feedback signal and the predetermined frequency is estimated according to the reference output frequency.

8. The control apparatus as claimed in claim 4, wherein the oscillating circuit comprises different sets of the fine-tuning circuit, each of which comprising different configurations of a plurality of capacitors and a plurality of resistors.

9. A control method applied to a portable apparatus, comprising:
- transmitting a feedback signal to a baseband controller by a driver;
- estimating an offset between a frequency of the feedback signal and a predetermined frequency by the baseband controller;
- providing a calibration signal to the driver according to the offset between the frequency of the feedback signal and the predetermined frequency by the baseband controller, wherein providing comprises searching a lookup table for a calibration code corresponding to the offset;
- generating an operating frequency based at least in part on a calibration value indicated in the calibration signal by the driver, by way of selecting a corresponding fine tuning circuit, such that a frequency of the feedback signal is correlated to the operating frequency, wherein the calibration code controls the fine tuning circuit; and
- generating a display control signal according to the operating frequency by the driver such that an offset between a frequency of the display control signal and the predetermined frequency is smaller than a predetermined error to meet operating requirements of the portable apparatus,
- wherein a display apparatus of the portable apparatus provides a user interface that presents an option of performing a calibration process resulting in generating the calibration signal.

10. The control method as claimed in claim 9, wherein the feedback signal is a frame mark signal, a signal outputted by a VCO, a signal outputted by a CCO, a common voltage signal, a horizontal synchronization signal, or a vertical synchronization signal.

11. The control method as claimed in claim 9, wherein the offset between the frequency of the feedback signal and the predetermined frequency is estimated according to an output frequency of a crystal oscillator.

12. The control method as claimed in claim 9, wherein the predetermined frequency is user-defined.

13. The control method as claimed in claim 9, further comprising storing the calibration code corresponding to the calibration signal into a register, the calibration code being accessed by the driver.

14. A driver applied to a portable multi-media apparatus, comprising:
- an oscillating circuit that receives a calibration signal from a baseband controller and, responsive to receiving the calibration signal, determines an operating frequency based at least in part on a calibration value corresponding to a calibration code in the calibration signal, by way of selecting a corresponding fine-tuning circuit, to generate a feedback signal having a frequency correlated to the operating frequency, the oscillating circuit configured to generate an operating frequency according to the calibration code; and
- a register, coupled to the oscillating circuit, that stores the calibration code in response to the calibration signal transmitted from the baseband controller; and
- an image processing unit, coupled to the oscillating circuit, that generates a display control signal according to the operating frequency and provides the display control signal to a display of the portable multi-media apparatus, the image processing unit configured to generate the display control signal such that an offset between a frequency of the display control signal and a predetermined frequency is smaller than a predetermined error to meet operating requirements of the portable multi-media apparatus,
- wherein the driver is coupled to the display of the portable multi-media apparatus and provides a user interface that presents an option of performing a calibration process resulting in receiving the calibration signal, and
- wherein the calibration code is obtained from a lookup table in the baseband controller.

15. The driver as claimed in claim 14, wherein the predetermined frequency is defined by a user via the user interface.

* * * * *